United States Patent
So

(10) Patent No.: US 7,733,733 B2
(45) Date of Patent: *Jun. 8, 2010

(54) DEVICE FOR WRITING DATA INTO MEMORY AND METHOD THEREOF

(75) Inventor: Kin-Ming So, Yuen Long (HK)

(73) Assignee: Princeton Technology Corporation, Taipei County (TW)

( * ) Notice: Subject to any disclaimer, the term of this patent is extended or adjusted under 35 U.S.C. 154(b) by 302 days.

This patent is subject to a terminal disclaimer.

(21) Appl. No.: 11/980,506

(22) Filed: Oct. 31, 2007

(65) Prior Publication Data

US 2008/0310239 A1    Dec. 18, 2008

(30) Foreign Application Priority Data

Jun. 13, 2007    (TW) ............................... 96121332 A

(51) Int. Cl.
*G11C 8/00*    (2006.01)
(52) U.S. Cl. .............. 365/230.03; 365/239; 365/189.05
(58) Field of Classification Search ............ 365/230.03, 365/239, 189, 5
See application file for complete search history.

(56) References Cited

U.S. PATENT DOCUMENTS 5,612,926 A * 3/1997 Yazawa et al. .............. 365/239

* cited by examiner

*Primary Examiner*—Huan Hoang
(74) *Attorney, Agent, or Firm*—Muncy, Geissler, Olds & Lowe, PLLC

(57) ABSTRACT

A device for writing data into a memory and a method thereof. The memory comprises a plurality of memory arrays. Each of the memory arrays comprises a plurality of memory cells. The data is divided into a plurality of segments. The segments are written into first memory cells of the memory cells of the memory arrays in sequence. The segments are written into second memory cells of the memory cells of the memory arrays when the first memory cells of the memory cells of the memory arrays are full, and so forth till the operation of writing the segments into the memory is completed.

20 Claims, 4 Drawing Sheets

SDRAM

| Branch0 | Branch1 | Branch2 | Branch3 |
|---------|---------|---------|---------|
| Branch4 | Branch5 | Branch6 | Branch7 |
| Branch8 | Branch9 | Branch10 | Branch11 |
| Branch12 | Branch13 | Branch14 | Branch15 |
| Branch16 | Branch17 | Branch18 | Branch19 |
| Branch20 | Branch21 | Branch22 | Branch23 |
| Branch24 | Branch25 | Branch26 | Branch27 |
| Branch28 | Branch29 | Branch30 | Branch31 |
| Branch32 | Branch33 | Branch34 | Branch35 |
| Branch36 | Branch37 | Branch38 | Branch39 |
| Branch40 | Branch41 | Branch42 | Branch43 |
| Branch44 | Branch45 | Branch46 | Branch47 |
| Branch48 | Branch49 | Branch50 | Branch51 |
| Bank 0 | Bank 1 | Bank 2 | Bank 3 |

FIG. 3

DEVICE FOR WRITING DATA INTO MEMORY AND METHOD THEREOF

BACKGROUND OF THE INVENTION

1. Field of the Invention

The present invention relates to devices for writing data into a memory and methods thereof, and in particular relates to devices for writing data into a memory in a DMB-TH system and methods thereof.

2. Description of the Related Art

Memory space of SDRAMs is usually divided into four Banks, which are Bank0, Bank1, Bank2 and Bank3 respectively. While writing data into an SDRAM, consequential data is saved in the four Banks respectively. Referring to FIG. 1, FIG. 1 shows the internal recording structure of an SDRAM. The internal part of the SDRAM is divided into four memory arrays, Bank0~Bank3. Each of the memory arrays comprises a plurality of memory cells. In conventional operational processes, while saving data in an SDRAM, the data is usually written into the memory arrays in sequence, from Bank0 to Bank3. Specifically, the memory array Bank1 would not be used until the memory array Bank0 is full. The data is written into the SDRAM completely in the aforementioned sequence.

However, according to the characteristics of an SDRAM, writing data from Bank0 to Bank3 requires a plurality of buffers to support the large number of data registering while reading and writing the data. Therefore, increased hardware is required, and data reading and writing efficiency is less than desired. Thus, a more novel method of writing data into an SDRAM more efficiently is desired.

BRIEF SUMMARY OF INVENTION

A detailed description is given in the following embodiments with reference to the accompanying drawings.

A method for writing data into a memory is disclosed. The memory comprises a plurality of memory arrays, and each of the memory arrays comprises a plurality of memory cells. A plurality of buffers configured to temporarily save the data which is going to be read and written are provided. A controller configured to divide the data into a plurality of segments and control the sequence of writing the segments into the memory is provided. The segments are written into first memory cells of the memory cells of the memory arrays in sequence. When the first memory cells of the memory cells of the memory arrays are full, the segments are written into second memory cells of the memory cells of the memory arrays and so forth till the operation of writing the segments into the memory is completed.

A method for writing data into a memory is disclosed. The memory comprises a plurality of memory arrays, and each of the memory arrays comprises a plurality of memory cells. The data is divided into a plurality of segments. The segments are written into first memory cells of the memory cells of the memory arrays in sequence. When the first memory cells of the memory cells of the memory arrays are full, the segments are written into second memory cells of the memory cells of the memory arrays and so forth till the operation of writing the segments into the memory is completed.

A device for writing data into a memory is disclosed. The device comprises a memory, a plurality of buffers and a controller. The memory comprises a plurality of memory arrays, and each of the memory arrays comprises a plurality of memory cells. The buffers are configured to temporarily save the data which is going to be read and written. The controller is configured to divide the data into a plurality of segments and control the sequence of writing the segments into the memory. The controller writes the segments into first memory cells of the memory cells of the memory arrays in sequence, begins writing the segments into second memory cells of the memory cells of the memory arrays when the first memory cells of the memory cells of the memory arrays are full, and so forth till the operation of writing the segments into the memory is completed.

BRIEF DESCRIPTION OF DRAWINGS

The present invention can be more fully understood by reading the subsequent detailed description and examples with references made to the accompanying drawings, wherein:

FIG. 3 is a diagram illustrating the structure of the memory data in an embodiment of the invention.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
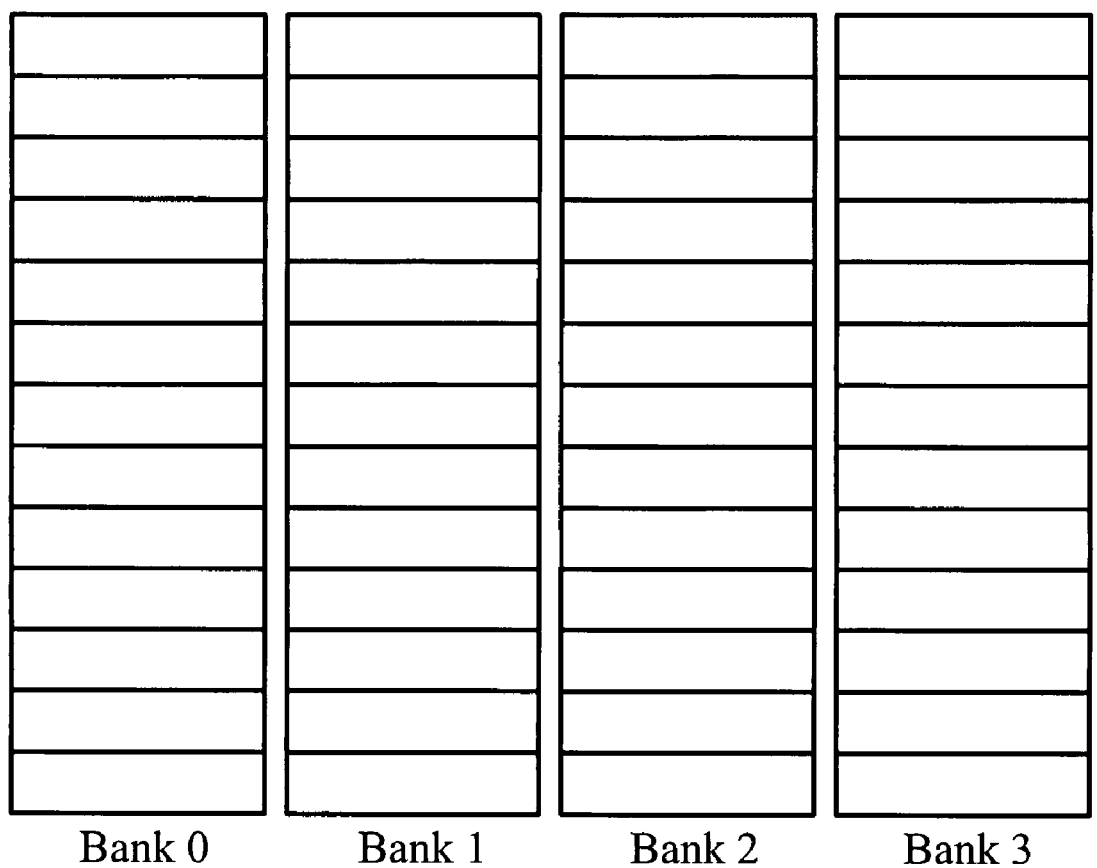
FIG. 1 is a diagram illustrating the internal recording structure of an SDRAM in an embodiment of the invention.
Figure 2:
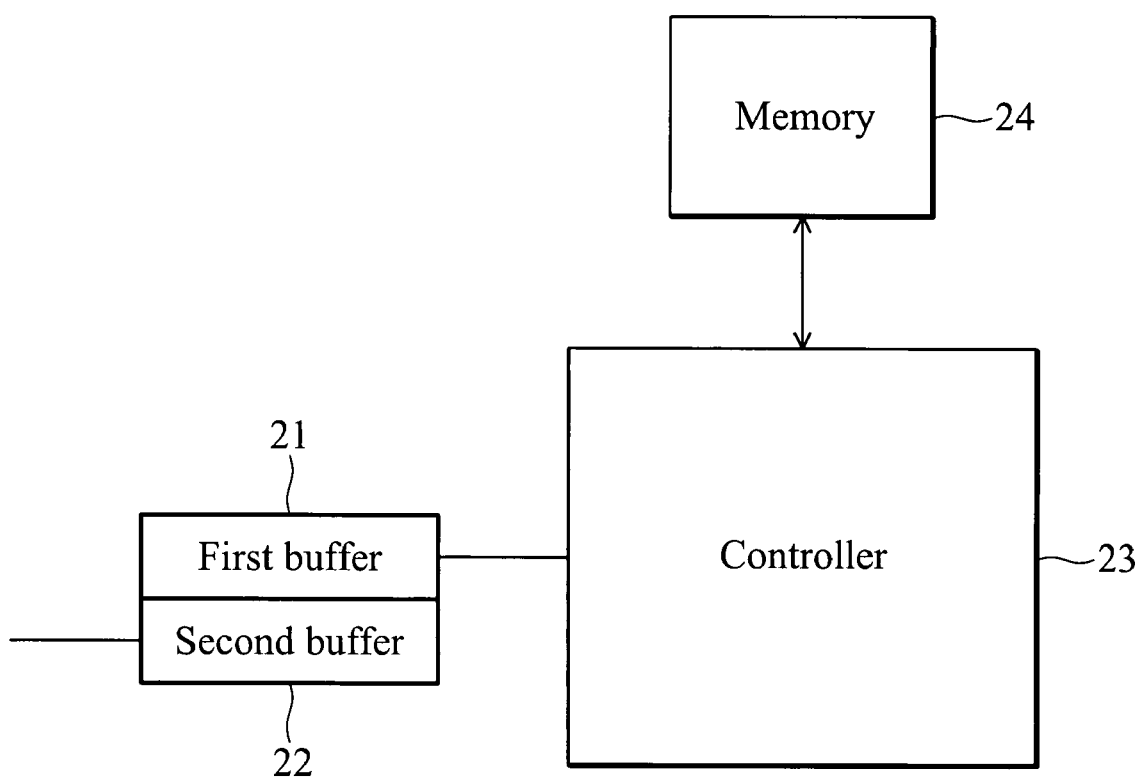
FIG. 2 is a diagram illustrating the structure of a device for writing data into a memory in an embodiment of the invention.

Referring to FIG. 2, FIG. 2 is a diagram illustrating the structure of a device for writing data into a memory disclosed in an exemplary embodiment of the invention. The device for writing data into memory 2 comprises a first buffer 21, a second buffer 22, a controller 23 and a memory 24. First buffer 21 and second buffer 22 are coupled to each other, and are coupled to controller 23 for reading data and temporarily saving data until controller 23 processes the data. Controller 23 is coupled to memory 24 for dividing the data into a plurality of segments and writing the data saved in first buffer 21 and second buffer 22 into memory 24 in sequence.

Referring to FIG. 3, FIG. 3 is a diagram illustrating the data structure of a memory in an exemplary embodiment of the invention. Memory 24 comprises four memory arrays, which are first memory array Bank0, second memory array Bank1, third memory array Bank2 and forth memory array Bank3. Each of the memory arrays comprises 13 memory cells. Accordingly, memory 24 comprises 52 memory cells, which are Branch0~Branch51. Branch0 is the first memory cell of Bank0, Branch1 is the first memory cell of Bank1, Branch2 is the first memory cell of Bank2, Branch3 is the first memory cell of Bank3, Branch4 is the second memory cell of Bank0, and so forth. Thus, the first memory array Bank0 comprises memory cells Branch4X ($0 \leq X < 13$, X is an integer); Bank1 comprises memory cells $4X+1$; Bank2 comprises memory cells branck$4X+2$; Bank3 comprises memory cells Branch$4X+3$. When controller 23 is writing the data into memory 24, the data is written in the sequence of Branch0, Branch1, Branch2, Branch3, . . . , Branch51. In another word, controller 23 writes the data into Bank1 before Bank0 is full, the data is written into the memory in the sequence of Bank0→Bank1→Bank2→Bank3→Bank0 . . . . For each memory array, the data is written into a memory cell at one time for conforming to the characteristics of the memory and increasing the efficiencies of data reading and writing.

In the embodiment, it is preferred that both the first buffer 21 and second buffer 22 be FIFO (first in first out) buffers which each save four banks of data with 20 bits, but it is not limited to the disclosed embodiments. First buffer 21 reads four banks of the data with 20 bits, the data is written into the first memory cells Branch0, Branch1, Branch2 and Branch3 of the memory arrays Bank0~Bank3 via the controller. Because the memory size of each memory cell is about 20 bits, first buffer 21 may temporarily save all the data which is going to be written into four memory cells. When the data saved in first buffer 21 is being written into the memory, second buffer 22 reads the next four banks of the data with 20 bits simultaneously and saves the data in second buffer 22. After the data saved in first buffer 21 has been written into the memory, then the data saved in second buffer 22 is written into the memory cells Branch4, Branch5, Branch6 and Branch7, the second memory cells of Bank0~Bank3. Accordingly, first buffer 21 temporarily saves the data which is going to be written into the first, the third, the fifth, . . . , and the thirteenth memory cells of the memory arrays Bank0~Bank3, and second buffer 22 temporarily saves the data which is going to be written into the second, the forth, the sixth, . . . , and the twelfth memory cells of the memory arrays Bank0~Bank3. In addition, when first buffer 21 performs the writing operation, second buffer 22 may perform the reading operation simultaneously, in which the operation of writing the data into the memory may be performed ceaselessly and is not influenced by the operation of reading. The whole device may be referred to as ReadWrite4Banks.

In the embodiment, memory 24 may be an SDRAM, and the device may be used in a DMB-TH system, but it is not limited to the disclosed embodiments.

Figure 4:
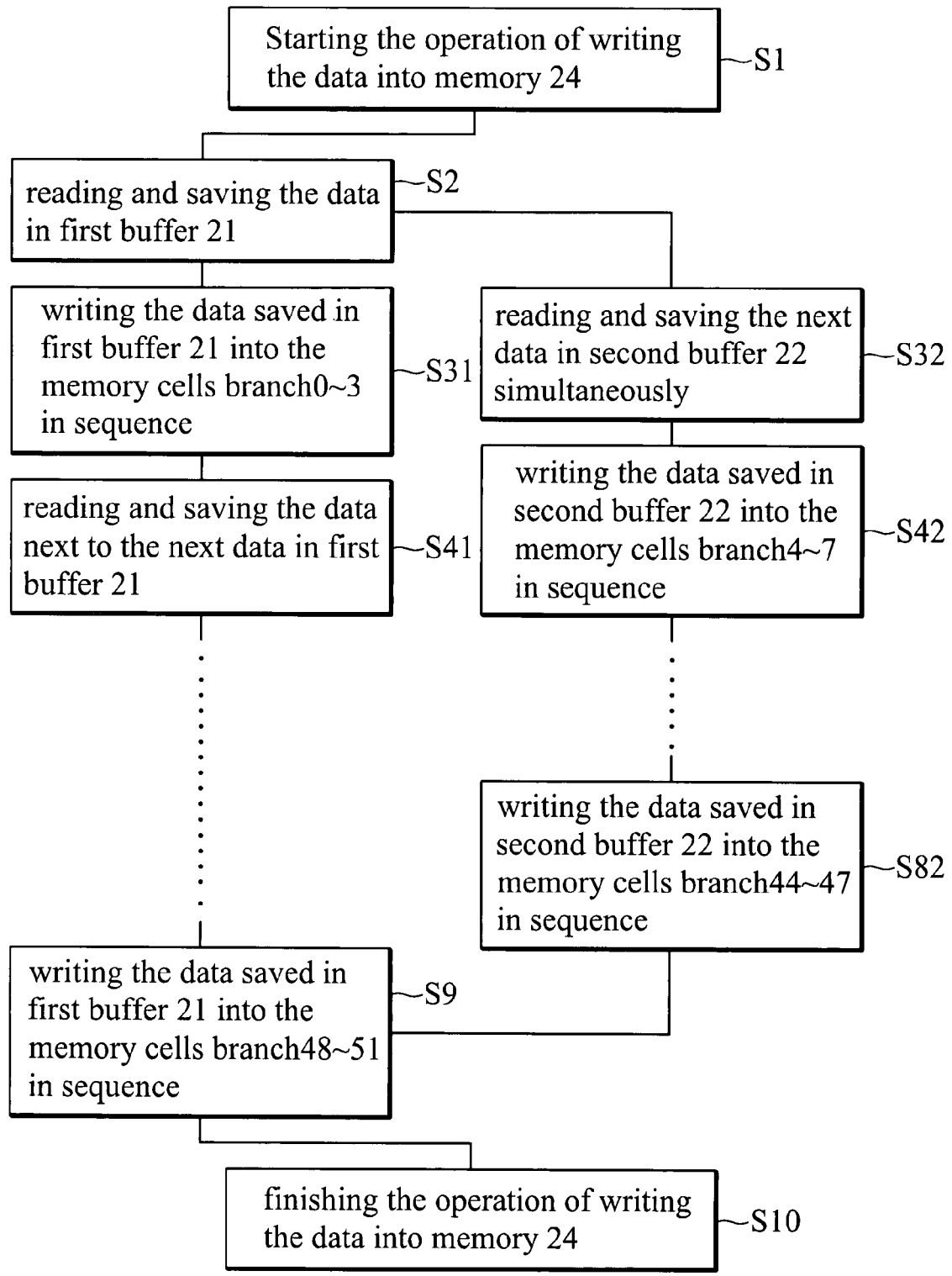
FIG. 4 is a diagram illustrating the steps of writing data into a memory in an embodiment of the invention.

Referring to FIG. 4, FIG. 4 is a diagram illustrating the steps of writing data into a memory. When the operation of writing the data into memory 24 is started (S1), the data is read dividedly and temporarily saved in first buffer 21 (S2). Then, controller 23 writes the data saved in first buffer 21 into the memory cells Branch0~3 in sequence (S31), and the next data are read dividedly and temporarily saved in second buffer 22 simultaneously (S32). Then, the data next to the next data are read dividedly and temporarily saved in first buffer 21 (S41), and controller 23 writes the data saved in second buffer 22 into the memory cells Branch4~7 in sequence (S42). The aforementioned operation is performed repeatedly in sequence until controller 23 writes the data saved in second buffer 22 into the memory cells Branch44~47 in sequence (S82) and writes the data saved in first buffer 21 into the memory cells Branch48~51 in sequence (S9) Finally, the operation of writing the data into memory 24 is finished (S10).

In the disclosed embodiments of the invention, the data are written into the SDRAM in sequence according to the characteristics of SDRAM. Not only does the speed of writing data into an SDRAM increase, but also the usage of buffers is conserved. Since the efficiency is increased and the costs are saved, the goal of improving the efficiency of SDRAM data writing is achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for writing data into a memory, wherein the memory comprises a plurality of memory arrays, each of the memory arrays comprises at least a first memory cell and a second memory cell, comprising:

providing a plurality of buffers configured to temporarily save the data which is going to be read and written;

providing a controller configured to divide the data into a plurality of segments and control the sequence of writing the segments into the memory;

writing the segments into the first memory cells of the memory arrays in sequence, writing the segments into the second memory cells of the memory arrays when the first memory cells of the memory arrays are full, and so forth to complete the operation of writing the segments into the memory.

2. The method for writing data into a memory as claimed in claim 1, wherein the memory comprises four memory arrays, which are a first, a second, a third and a forth memory array respectively, and each memory array comprises thirteen memory cells.

3. The method for writing data into a memory as claimed in claim 1, wherein the buffers comprise a first buffer and a second buffer, in which the first buffer and the second buffer are both FIFO (first in first out) buffers with 4*20 bits.

4. The method for writing data into a memory as claimed in claim 3, wherein both the first buffer and the second buffer each temporarily saves four of the segments with 20 bits, and the buffers saves eight of the segments in total.

5. The method for writing data into a memory as claimed in claim 4, wherein the buffers read and write eight of the segments simultaneously.

6. The method for writing data into a memory as claimed in claim 2, wherein the first buffer temporarily saves the segments which are going to be written into the first, the third, the fifth, . . . , and the thirteenth memory cells of the memory arrays, the second buffer temporarily saves the segments which are going to be written into the second, the forth, the sixth, . . . , and the twelfth memory cells of the memory arrays.

7. The method to write data into the memory as claimed in claim 1, wherein the method is used in a DMB-TH system.

8. A method for writing data into a memory, wherein the memory comprises a plurality of memory arrays, each of the memory arrays comprises at least a first memory cell and a second memory cell, the data is divided into a plurality of segments, comprising writing the segments into the first memory cells of the memory arrays in sequence, writing the segments into the second memory cells of the memory arrays when the first memory cells of the memory arrays are full, and so forth to complete the operation of writing the segments into the memory.

9. The method for writing data into a memory as claimed in claim 8, further comprising: providing a plurality of buffers configured to temporarily save the data which is going to be read and written; and providing a controller configured to divide the data into the segments and control the sequence of writing the segments into the memory.

10. The method for writing data into a memory as claimed in claim 8, wherein the buffers comprise a first buffer and a second buffer, in which the first buffer and the second buffer are both FIFO (first in first out) buffers with 4*20 bits.

11. The method for writing data into a memory as claimed in claim 8, wherein the memory comprises four memory arrays, which are a first, a second, a third and a forth memory arrays respectively, and each memory array comprises thirteen memory cells.

12. The method for writing data into the memory as claimed in claim 11, wherein the first buffer temporarily saves the segments which are going to be written into the first, the third, the fifth, . . . , and the thirteenth memory cells of the memory arrays, the second buffer temporarily saves the segments which are going to be written into the second, the forth, the sixth, . . . , and the twelfth memory cells of the memory arrays.

13. The method for writing data into the memory as claimed in claim 12, wherein both the first buffer and the second buffer each temporarily saves four of the segments with 20 bits, and the buffers save eight of the segments in total.

14. The method for writing data into a memory as claimed in claim 13, wherein the buffers read and write eight of the segments simultaneously.

15. The method for writing data into a memory as claimed in claim 8, wherein the method is used in a DMB-TH system.

16. A device for writing data into a memory, comprising:
a memory comprising a plurality of memory arrays, and each of the memory arrays comprises at least a first memory cell and a second memory cell;
a plurality of buffers configured to temporarily save the data which is going to be read and written; and
a controller configured to divide the data into a plurality of segments and control the sequence of writing the segments into the memory;
wherein the controller writes the segments into the first memory cells of the memory arrays in sequence, into the second memory cells of the memory arrays when the first memory cells of the memory arrays are full, and so forth to complete the operation of writing the segments into the memory.

17. The device for writing data into a memory as claimed in claim 16, wherein the memory comprises four memory arrays, which are a first, a second, a third and a forth memory array respectively, each memory array comprises thirteen memory cells, and the buffers comprise a first buffer and a second buffer, in which the first buffer and the second buffer are both FIFO (first in first out) buffers with 4*20 bits.

18. The device for writing data into a memory as claimed in claim 17, wherein the first buffer temporarily saves the segments which are going to be written into the first, the third, the fifth, . . . , and the thirteenth memory cells of the memory arrays, the second buffer temporarily saves the segments which are going to be written into the second, the forth, the sixth, . . . , and the twelfth memory cells of the memory arrays.

19. The device for writing data into the memory as claimed in claim 17, wherein both the first buffer and the second buffer each temporarily saves four of the segments with 20 bits, the buffers save eight of the segments in total, and the buffers read and write eight of the segments simultaneously.

20. The device for writing data into the memory as claimed in claim 16, wherein the device is used in a DMB-TH system.

* * * * *